United States Patent [19]

Kobatake

[11] Patent Number: 5,066,870

[45] Date of Patent: Nov. 19, 1991

[54] CHARGE PUMP HAVING PULL-UP CIRCUIT OPERATING WITH TWO CLOCK PULSE SEQUENCES

[75] Inventor: Hiroyuki Kobatake, Tokyo, Japan

[73] Assignee: NEC Corporation, Tokyo, Japan

[21] Appl. No.: 541,808

[22] Filed: Jun. 20, 1990

[30] Foreign Application Priority Data

Jun. 20, 1989 [JP] Japan ................................. 1-158587

[51] Int. Cl.[5] ........................ H03K 3/01; H03K 5/13; H03K 19/01; H03L 5/00
[52] U.S. Cl. ............................. 307/296.1; 307/296.5; 307/269; 307/590; 307/601; 307/264; 307/482
[58] Field of Search ............... 307/296.1, 296.2, 296.5, 307/590, 269, 246, 264, 601, 482

[56] References Cited

U.S. PATENT DOCUMENTS

| | | | |
|---|---|---|---|
| 3,938,109 | 2/1976 | Gionis et al. | 307/463 |
| 4,500,799 | 2/1985 | Sud et al. | 307/605 |
| 4,570,244 | 2/1986 | Sud et al. | 307/246 |
| 4,970,409 | 11/1990 | Wada et al. | 307/296.5 |
| 5,010,259 | 4/1991 | Inoue et al. | 307/482 |

Primary Examiner—Stanley D. Miller
Assistant Examiner—Trong Phan
Attorney, Agent, or Firm—Whitham & Marhoefer

[57] ABSTRACT

A charge pump comprises a charge-up circuit connected to a voltage source, and a clock generator. A pull-up circuit is formed by an enhancement mode MOSFET and a time constant circuit. The MOSFET has its drain coupled to the charge-up circuit and its source connected to the output terminal of the charge pump. The clock generator produces first and second clock pulse sequences, with the duration of the first clock pulse sequence being greater than the pulse duration of the second clock pulse sequence. The time constant circuit has two capacitors and a resistor connected therebetween to respond to the first and second clock pulse sequences by successively applying voltages to the drain and gate of the MOSFET. The charge-up circuit is formed by a depletion mode or an enhancement mode MOSFET which is responsive to one or more clock pulse sequences with pulses preceding those of the first and second clock sequences.

12 Claims, 4 Drawing Sheets

CHARGE PUMP HAVING PULL-UP CIRCUIT OPERATING WITH TWO CLOCK PULSE SEQUENCES

BACKGROUND OF THE INVENTION

The present invention relates to semiconductor circuits, and more specifically to a charge pump which is used in integrated circuits.

As shown in FIG. 1, a prior art charge pump comprises a charge-up circuit 1 and a pull-up circuit 2. Charge-up circuit 1 is formed by an N-channel enhancement mode MOSFET (field effect transistor) 1 whose drain and gate are coupled to a voltage supply 4 at voltage $V_{CC}$ and whose source is coupled to the drain and gate of an N-channel enhancement mode MOSFET 5 of charge-up circuit 2 and hence to a clock source $\phi$ through a capacitor 6. The source of MOSFET 5 is coupled to an output terminal 7 which is in turn connected to a suitable utilization circuit. When clock sequence $\Phi$ switches to low level, the drain of MOSFET 5 is driven by MOSFET 3 and its potential increases as indicated by a dotted line in FIG. 2 to a level $V_{CC}-V_{Te}$ (where $V_{Te}$ is the threshold of MOSFET 3). On reaching this level, MOSFET 3 is turned off. When clock sequence goes high, the voltage at the drain of MOSFET 5 rises sharply to a level $V_{CC}-V_{Te}+V_\phi$ is the voltage of the clock sequence) by the action of capacitor 6. This voltage is applied through MOSFET 5 to output terminal 7, producing an output voltage $(V_{cc}-V_{Te})+(V_\phi-V_{Te})$ which is indicated by a solid line curve in FIG. 2. To obtain a higher output voltage, pull-up circuits 2-1, 2-2 and 2-3 are cascaded as shown in FIG. 3 such that the second stage is supplied with clock sequence of opposite phase to those of clock sequences supplied to the odd-numbered stages. The voltage at the drain of MOSFET 5-2 is driven to a level equal to $(V_{CC}-V_{Te})+(V_\phi-V_{Te})$ when the opposite phase clock is at low level. When the opposite-phase clock goes high, the drain of MOSFET 5-2 is driven to a level equal to $(V_{CC}-V_{Te})+(V_\phi-V_{Te})+V_\phi$ which is applied through MOSFET 5-2 to the drain of MOSFET 5-3, which, as a result, rises to a level $(V_{CC}-V_{Te})+(V_\phi-V_{Te})+(V_\phi-V_{Te})$. The output voltage of this multi-stage circuit is equal to $(V_{cc}-V_{Te})+N(V_\phi-V_{Te})$, where N represents the number of cascaded pull-up circuits 2. Usually $V_\phi$ is set equal to $V_{CC}$, and the output voltage is $2 V_{CC}-2 V_{Te}$. Since the threshold voltage $V_{Te}$ is of a substantial value in comparison with $V_{CC}$, the output voltage is too low for some applications. If source voltage $V_{CC}$ is equal to or lower than the threshold voltage $V_{Te}$, the charge-up circuit becomes inoperative, and if $V_\phi \leq V_{Te}$ the pull-up circuit becomes inoperative. In either case, the charge pump is inoperative. In addition, a large number of pull-up circuits would be required. For example, if $V_{CC}=V_\phi=1.5$ volts, $V_{Te}=1.0$ volt, twenty-nine pull-up circuits are required to obtain an output voltage of 15 volts.

SUMMARY OF THE INVENTION

It is therefore an object of the present invention to provide a charge pump capable of generating a high output voltage.

According to the present invention, there is provided a charge pump which comprises a charge-up circuit connected to a voltage source, a pull-up circuit connected to the charge-up circuit, and a clock generator. The pull-up circuit is formed by an enhancement mode field-effect transistor and a time constant circuit. The clock generator generates first and second clock pulse sequences respectively at first and second output terminals thereof. The field-effect transistor has a drain-source path coupled between the charge-up circuit and the output terminal of the charge pump. The time constant circuit is formed by two capacitors and a resistive element connected therebetween, the time constant circuit being connected across the first and second output terminals of the clock generator for successively applying voltages to one end of the drain-source path and gate of the field-effect transistor in response to the first and second clock pulse sequences.

Preferably, the first clock pulse sequence has a pulse duration greater than the pulse duration of the second clock pulse sequence.

In one preferred embodiment, the charge-up circuit comprises a depletion mode field-effect transistor having its drain coupled to the voltage source, and its source connected to the drain of the enhancement mode field-effect transistor of the pull-up circuit. The gate of this depletion mode field-effect transistor is responsive to a clock pulse which occurs prior to the first clock pulse sequence. In a second preferred form of this invention, the charge-up circuit comprises an enhancement mode field-effect transistor and a time constant circuit associated with this field-effect transistor. This enhancement mode field-effect transistor has its drain-source path connected between the voltage source and one end of the drain-source path of the field-effect transistor of the pull-up circuit. The clock generator additionally generates two clock pulse sequences with successive pulses preceding the clock sequences supplied to the pull-up circuit. The time constant circuit of the charge-up circuit is responsive to the additional clock pulse sequences to successively apply voltages to the gate of the associated enhancement mode field-effect transistor.

The present invention further provides a multi-stage charge pump which includes a charge-up circuit connected to a voltage source, a clock generator for generating first, second, third and fourth clock pulse sequences for pull-up operation. A first pull-up circuit comprises a first enhancement mode field-effect transistor having its drain coupled to the charge-up circuit, a first time constant circuit responds to the first and second clock sequences by successively applying voltages to one end of the drain-source path and gate of the first field-effect transistor. A second pull-up circuit comprises a second enhancement mode field-effect transistor having one end its drain-source path connected to the other end of the drain-source path of the first enhancement mode field-effect transistor, the other end of its drain-source path being coupled to an output terminal of the charge pump. A second time constant circuit responds to the third and fourth clock pulse sequences by successively applying voltages to one end of the drain-source path and gate of the second enhancement mode field-effect transistor.

BRIEF DESCRIPTION OF THE DRAWINGS

The present invention will be described in further detail with reference to the accompanying drawings, in which.

DETAILED DESCRIPTION

Figure 4:
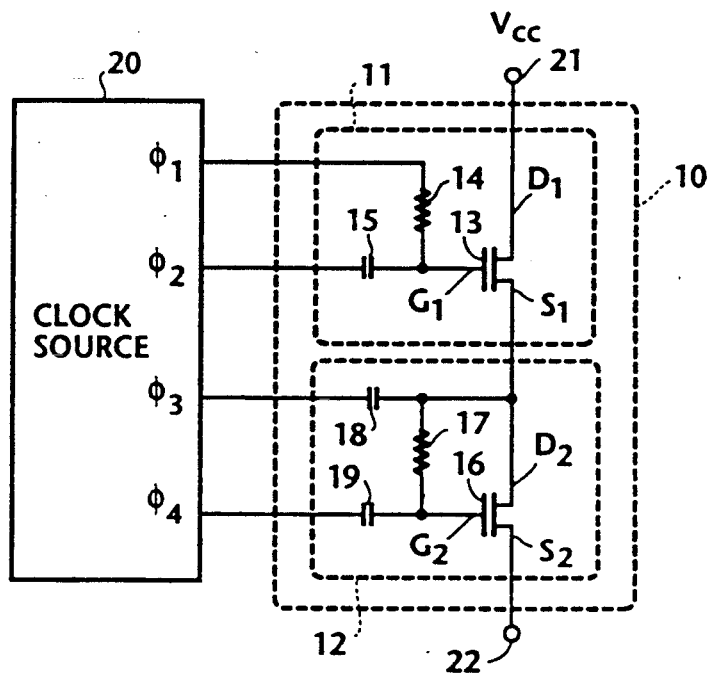
FIG. 4 is a circuit diagram of a charge pump according to an embodiment of the present invention.

Referring now to FIG. 4, there is shown a charge pump according to an embodiment of the present invention. The charge pump shown at 10 comprises a charge-up circuit 11 and a pull-up circuit 12. Charge-up circuit 11 comprises an N-channel enhancement mode MOSFET 13 having a gate $G_1$ coupled through a resistor 14 to a clock source 20 to receive a first clock pulse sequence $\phi_1$ and through a capacitor 15 to receive a second clock sequence $\phi_2$. MOSFET 13 has its drain $D_1$ connected to a voltage supply 21 to receive source voltage $V_{CC}$ and its source $S_1$ coupled to the drain $D_2$ of an N-channel enhancement mode MOSFET 16 of charge-up circuit 12. MOSFET 16 has its gate $G_2$ and drain $D_2$ coupled together by a resistor 17, with the drain $D_2$ being further coupled through a capacitor 18 to clock source 20 to receive a third clock sequence $\phi_3$ and the gate $G_2$ being further coupled through a capacitor 19 to the clock source to receive a fourth clock sequence $\phi_4$.

Resistor 14 and capacitor 15 form a series circuit across terminals $\phi_1$ and $\phi_2$ of clock source 20 with a time constant value $R_1$-$C_1$ (where $R_1$ and $C_1$ are the resistance and capacitance values of resistor 14 and capacitor 15, respectively). Likewise, resistor 17 and capacitor 19 present a series circuit between drain $D_2$ of MOSFET 16 and clock terminal $\phi_4$ with a time constant value $C_2$-$R_2$ (where $C_2$ is the capacitance of capacitor 19 and $R_2$ is the resistance of resistor 17). The source $S_2$ of MOSFET 16 is coupled to the output terminal 22 of the charge pump 10 to which a utilization circuit is connected.

Figure 5:
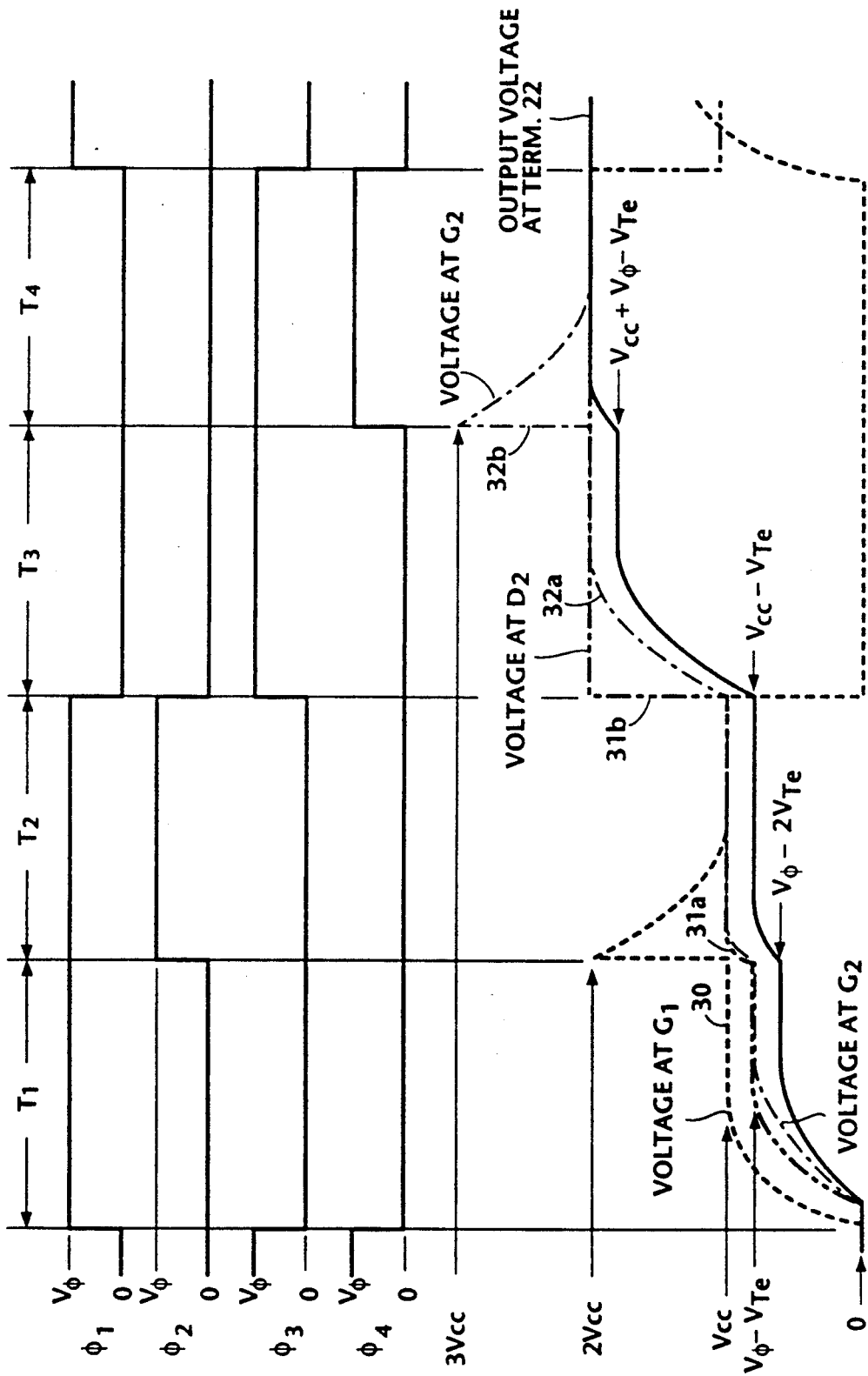
FIG. 5 is a waveform diagram associated with the embodiment of this invention.

The first to fourth clock sequences have the waveforms as shown in FIG. 5. The first and third clock sequences $\phi_1$ and $\phi_3$ are of opposite polarity of the same clock period which is twice the period of clock sequences $\phi_2$ and $\phi_4$ so that these clock sequences produce a unique combination of four different voltage levels respectively for periods $T_1$, $T_2$, $T_3$ and $T_4$. Specifically, during period $T_1$, clock sequence $\phi_1$ is at high voltage $V_\phi$ and all other clock sequences are at zero voltage. During period $T_2$, clock sequences $\phi_1$ and $\phi_2$ are at voltage $V_\phi$ and other sequences are at zero voltage. During period $T_3$, only clock sequence $\phi_3$ is at high level, and during the last period $T_4$, $\phi_3$ and $\phi_4$ are at high level. Note that the time constant value $C_1$-$R_1$ is much smaller than period $T_1$ or $T_2$ and the time constant value $C_2$-$R_2$ is much smaller than period $T_3$ or $T_4$.

Assume that the voltage $V_\phi$ is equal to source voltage $V_{CC}$. During period $T_1$, a voltage difference $V_\phi$ develops across terminals $\phi_1$ and $\phi_2$ and capacitor 15 is charged through resistor 14, generating a potential which rises exponentially at the gate $G_1$ of MOSFET 13, following a curve $V_\phi = 1 - e^{-t/C_1 \cdot R_1}$ as indicated by a dotted line 30 in FIG. 5. Since $T_1$ is much greater than time constant $C_1$-$R_1$, the voltage at gate $G_1$ will eventually reach $V_\phi (=V_{CC})$ within period $T_1$. During period $T_2$, clock terminal $\phi_2$ is driven to the same potential as at terminal $\phi_1$. This voltage adds up to the voltage developed across capacitor 15, presenting a voltage 2 $V_\phi$ to gate $G_1$. This voltage decays exponentially following a curve $V_\phi = 1 - e^{-t/R_1 C_1}$ to the $V_\phi$ level within period $T_2$ as illustrated. At the instant the voltage at gate $G_1$ rises to the level 2 $V_{CC}$, the voltage at the drain $D_2$ of MOSFET 16 is driven to $V_{CC}$ as shown at 31a if $V_{CC}$ is equal to or lower than 2 $V_\phi - V_{Te}$ (where $V_{Te}$ is the threshold voltage of enhancement mode MOSFET 13), or driven to 2 $V_\phi - V_{Te}$ if $V_{CC}$ is higher than 2 $V_\phi - V_{Te}$.

During period $T_3$ in which the third clock sequence $\phi_3$ is the only one that is driven to high level, the voltage $V_\phi$ of this clock sequence is supplied through capacitor 18 to the drain $D_2$ of MOSFET 16, so that the voltage at drain $D_2$ sharply rises to a level 2 $V_\phi (=2 V_{CC})$ as shown at 31b in FIG. 5, and capacitor 19 is charged through resistor 17. Since the time constant $C_2$-$R_2$ is smaller than $T_3$, the voltage at the gate $G_2$ of MOSFET 16 rises exponentially as shown at 32a to the same level as at the drain $D_2$ of MOSFET 16 within period $T_3$.

During the successive periods $T_1$ through $T_3$, the voltage at the output terminal 22 increases exponentially in a stepwise manner. Specifically, it exponentially increases to a level $V_\phi - 2 V_{Te}$ during $T_1$, rises to a level $V_{CC} - V_{Te}$ during $T_2$, and jumps to a level $V_{CC} + V_\phi - V_{Te}$ during $T_3$.

During the next period $T_4$ in which the third and fourth clock sequences are at high level, the voltage at the gate $G_2$ of MOSFET 16 rapidly rises as shown at 32b to a level which is three times as high as the source voltage $V_{CC}$. This voltage level is equal to the potential at the drain $G_2$ plus 2 $V_\phi$. Since the time constant $C_2$-$R_2$ is much smaller than period $T_4$, the voltage at gate $G_2$ decays exponentially to the same voltage level as at the drain $D_2$ during period $T_4$. During period $T_4$, the voltage at the output terminal 22 further increases to the level 2 $V_{CC}$.

When the potential at gate $G_2$ increased to 3 $V_{CC}$, the voltage $V_{OUT}$ at the output terminal 22 increases from the level ($V_{CC} + V_\phi - V_{Te}$) to 2 $V_{CC}$ (= voltage at drain $D_2 + V_\phi$) if $V_\phi$ is equal to or higher than $V_{Te}$, or increases to a level equal to the voltage at drain $D_2 + 2 V_\phi - V_{Te}$ if $V_\phi$ is lower than $V_{Te}$.

It is seen that the voltage obtained by the use of a single pull-up circuit of this invention is equal to $V_\phi$ if $V_\phi \geq V_{Te}$ or 2 $V_\phi - V_{Te}$ if $V_\phi < V_{Te}$.

It is seen from the foregoing that as long as a relation $V_\phi > V_{Te}/2$ holds both charge-up and pull-up circuits operate satisfactorily. Since the voltage $V_\phi$ of the clock sequences for MOS integrated circuitry is usually equal to the source voltage $V_{CC}$, the charge pump of this invention can operate satisfactorily even when the source voltage is at very low level. For example, if $V_{Te}$ is 1.0 volt, the charge pump will operate at a source voltage of 0.5 volts.

Figure 6:
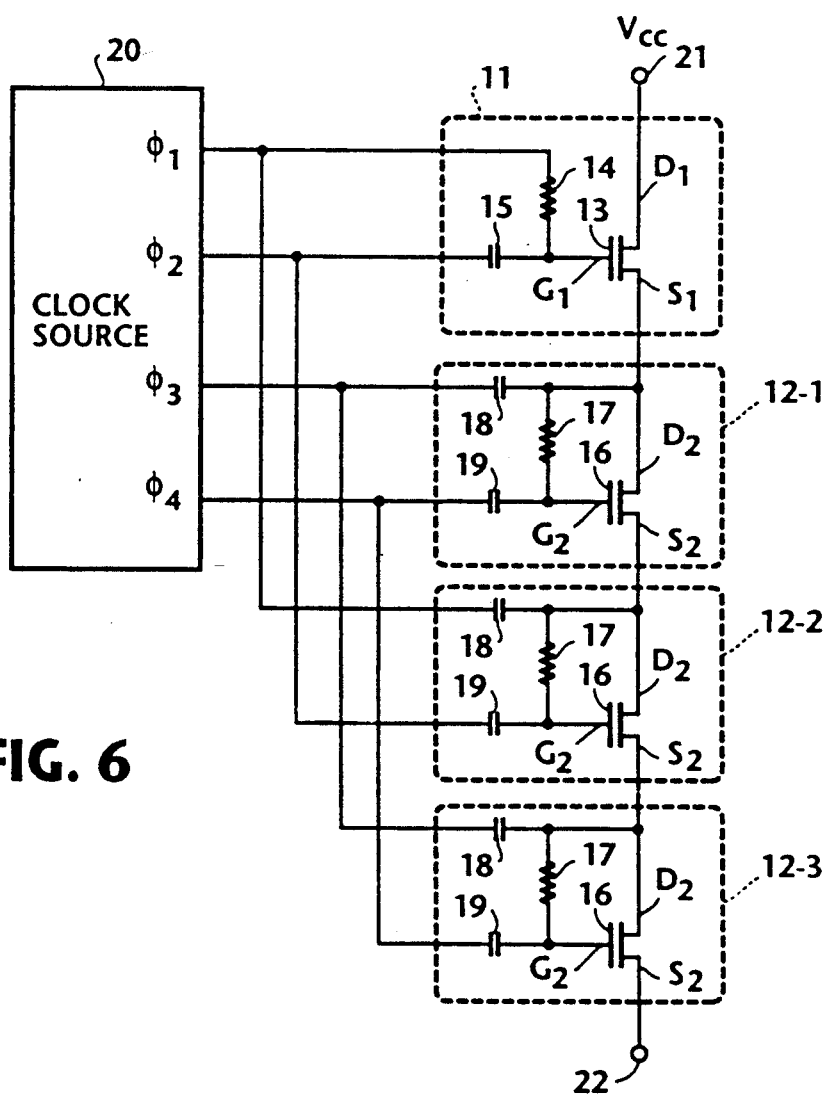
FIG. 6 is a circuit diagram of a multi-stage charge pump of this invention.

A higher output voltage can be obtained by cascading pull-up circuits 12-1, 12-2 and 12-3 as shown in FIG. 6 such that the phases of clock sequences supplied to the even-numbered stage 12-2 are opposite to the phases of clock sequences supplied to the odd-numbered pull-up circuits 12-1, 12-3. Since the voltage at the drain $D_2$ of each pull-up circuit is either $V_\phi$ or $2V_\phi - V_{Te}$, the output voltage $V_{OUT}$ is equal to the voltage at drain $D_2$ plus $NV_\phi$ if $V_\phi$ is equal to or higher than $V_{Te}$, or equal to the voltage at drain $D_2$ plus $N(2V_\phi - V_{Te})$ if $V_\phi$ is lower than $V_{Te}$ (where N is the number of cascaded pull-up circuits).

Therefore, the number of pull-up circuits necessary for a given application can be reduced in comparison with the prior art charge pump. For example, if $V_{CC} = V_\phi = 1.5$ volts and $V_{Te} = 1.0$ volt, nine pull-up circuits will be sufficient to obtain an output voltage of 15 volts.

Figure 7:
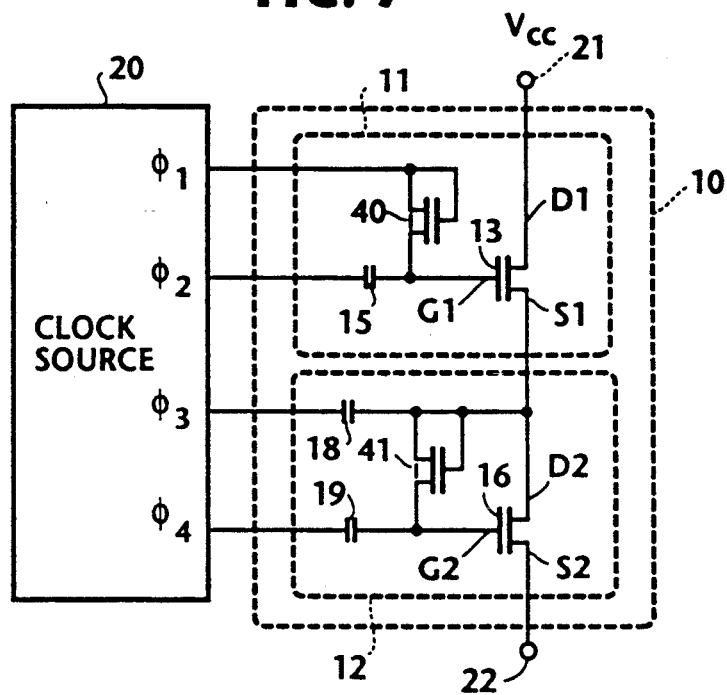
FIG. 7 is a circuit diagram of a modification of this invention.

To reduce the amount of space for implementing the charge pump, resistors 14 and 17 are preferably replaced with N-channel depletion mode MOSFETs 40 and 41, respectively, as shown in FIG. 7. Each of these MOSFETs has its gate and drain electrodes coupled together to form an equivalent resistance element. Alternatively, the gate and source electrodes may be coupled together to form a resistor.

Figure 1:
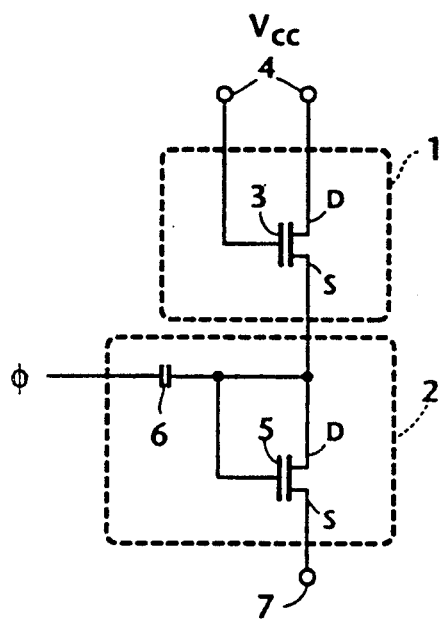
FIG. 1 is a circuit diagram of a prior art charge pump.
Figure 2:
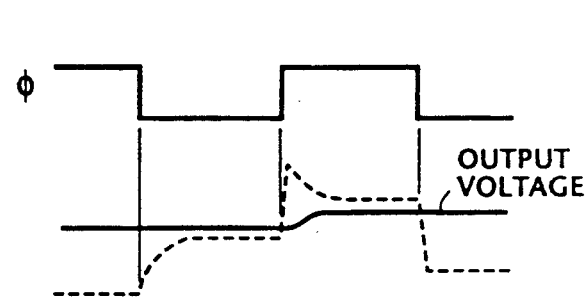
FIG. 2 is a waveform diagram associated with the prior art charge pump.
Figure 3:
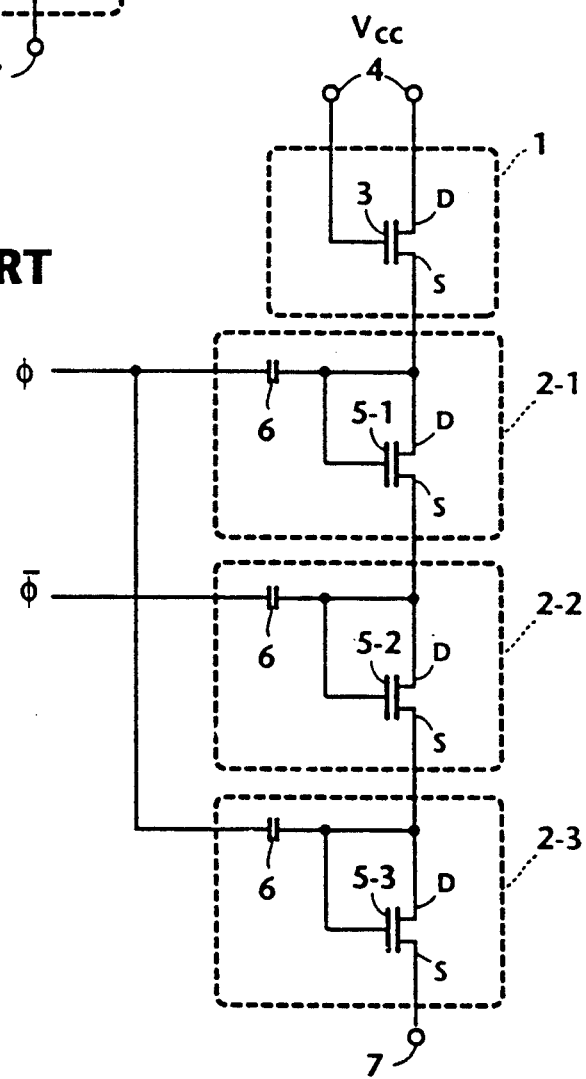
FIG. 3 is a circuit diagram of a prior art multi-stage charge pump.
Figure 8:
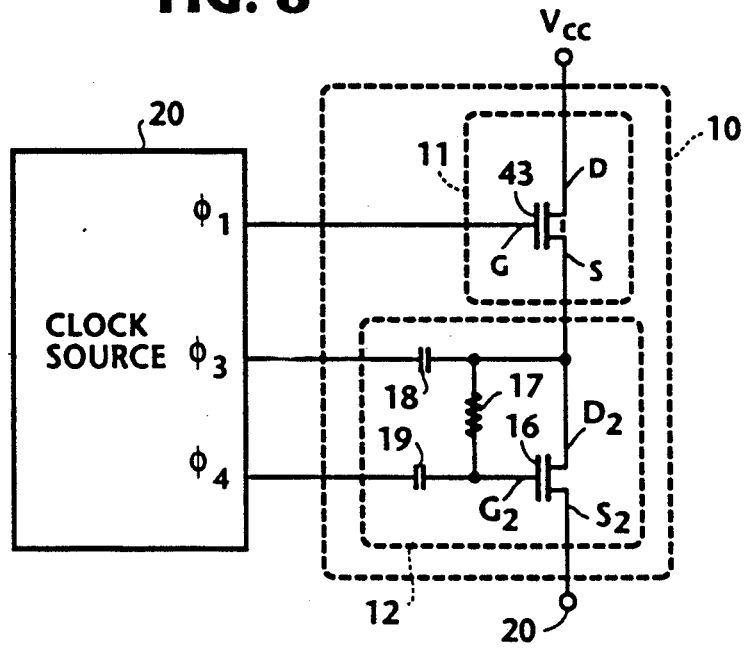
FIG. 8 is a circuit diagram of a further modification of this invention.

A modified embodiment of this invention is shown in FIG. 8 which differs from the embodiment of FIG. 4 in that the charge-up circuit of FIG. 1 is replaced with an N-channel depletion mode MOSFET 43 having a threshold voltage $-V_{Td}$. The gate of MOSFET 43 is coupled to the first clock terminal $\phi_1$ with its drain D and source S being coupled respectively to terminal 21 and drain $D_2$ of MOSFET 16. When the first clock sequence $\phi_1$ is at high voltage level, the voltage at drain $D_2$ of MOSFET 16 is equal to $V_{CC}$ if $V_{CC}$ is equal to or smaller than $V_\phi + V_{Td}$, or $V_\phi + V_{Td}$ if $V_{CC}$ is higher than $V_\phi + V_{Td}$.

If $V_{CC} > V_\phi + V_{Td}$, source voltage $V_{CC}$ must also be higher than the absolute value of the threshold $V_{Td}$ to ensure that MOSFET 43 turns off when the first clock sequence $\phi_1$ is at low voltage.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A charge pump comprising:
   a charge-up circuit connected to a voltage source;
   clock generator means for generating first and second clock pulse sequences respectively at first and second output terminals of the clock generator means;
   a field-effect transistor having a drain-source path connected between said charge-up circuit and an output terminal of the charge pump, and a gate electrode; and
   a time constant circuit having first and second capacitive elements and a resistive element connected therebetween, said time constant circuit being connected across said first and second output terminals of said clock generator means for successively applying voltages to one end of the drain-source path and gate electrode of said transistor in response to said first and second clock pulse sequences.

2. A charge pump as claimed in claim 1, wherein said first clock pulse sequence has a pulse duration greater than a pulse duration of said second clock pulse sequence.

3. A charge pump comprising:
   clock generator means for generating first, second and third clock pulse sequences respectively at first, second and third output terminals of the clock generator means;
   a depletion mode field-effect transistor having a drain-source path connected at one end to a voltage source, and a gate electrode connected to the first output terminal of said clock generator means;
   an enhancement mode field-effect transistor having a drain-source path connected to the other end of said drain-source path of said first field-effect transistor and connected at the other end to an output terminal of the charge pump, and a gate electrode; and
   a time constant circuit having first and second capacitive elements and a resistive element connected therebetween, said time constant circuit being connected across said second and third output terminals of said clock generator means for successively applying a voltage to one end of the drain-source path and to the gate electrode of said enhancement mode field-effect transistor in response to said second and third clock pulse sequences.

4. A charge pump as claimed in claim 3, wherein said second clock pulse sequence has a pulse duration greater than a pulse duration of said third clock pulse sequence.

5. A charge pump as claimed in claim 3, wherein the resistive element of said time constant circuit comprises a second depletion mode field-effect transistor having a drain-source path and a gate electrode connected to one end of the gate electrode of the second depletion mode field-effect transistor.

6. A charge pump comprising:
   clock generator means for generating first, second, third and fourth clock pulse sequences respectively at first, second, third and fourth output terminals of the clock generator means;
   a first enhancement mode field-effect transistor having a drain-source path connected at one end to a voltage source, and a gate electrode;
   a first time constant circuit having a capacitive element and a resistive element connected across said first and second output terminals of said clock generator means for successively applying voltages to the gate electrode of said first enhancement mode field-effect transistor in response to said first and second clock pulse sequences;
   a second enhancement mode field-effect transistor having a drain-source path connected between the source electrode of said first enhancement mode field-effect transistor and an output terminal of the charge pump, and a gate electrode; and
   a second time constant circuit having first and second capacitive elements and a resistive element connected therebetween, said time constant circuit being connected across said third and fourth output terminals of said clock generator means for successively applying voltages to one end of the drain-source path and gate electrode of said second enhancement mode field-effect transistor in response to said third and fourth clock pulse sequences.

7. A charge pump as claimed in claim 6, wherein said first clock pulse sequence has a pulse duration greater than a pulse duration of said second clock pulse sequence and said third clock pulse sequence has a pulse duration greater than a pulse duration of said fourth clock pulse sequence.

8. A charge pump as claimed in claim 6, wherein the resistive element of each of said first and second time constant circuits comprises a depletion mode field-effect transistor having a gate electrode and a drain-source path connected at one end to the gate electrode of the depletion mode field-effect transistor.

9. A multi-stage charge pump comprising:
a charge-up circuit connected to a voltage source;
clock generator means for generating first, second, third and fourth clock pulse sequences respectively at first, second, third and fourth output terminals of the clock generator means;
a first enhancement mode field-effect transistor having a drain-source path connected at one end to said charge-up circuit, and a gate electrode;
a first time constant circuit having first and second capacitive elements and a resistive element connected therebetween, said first time constant circuit being connected across said first and second output terminals of said clock generator means for successively applying voltages to one end of the drain-source path and gate electrode of said first enhancement mode field-effect transistor in response to said first and second clock pulse sequences;
a second enhancement mode field-effect transistor having a drain-source path connected between the source electrode of said first field-effect transistor and an output terminal of the charge pump, and a gate electrode; and
a second time constant circuit having first and second capacitive elements and a resistive element connected therebetween, said second time constant circuit being connected across said third and fourth output terminals of said clock generator means for successively applying voltages to one end of the drain-source path and gate electrode of said second enhancement mode field-effect transistor in response to said third and fourth clock pulse sequences.

10. A multi-stage charge pump as claimed in claim 9, wherein said first clock pulse sequence has a pulse duration greater than a pulse duration of said second clock pulse sequence and said third clock pulse sequence has a pulse duration greater than a pulse duration of said fourth clock pulse sequence.

11. A multi-stage charge pump as claimed in claim 9, wherein said charge-up circuit comprises a depletion mode field-effect transistor having a drain-source path connected between said voltage source and one end of the drain-source path of said first enhancement mode field-effect transistor, and a gate electrode connected to one of said third and fourth output terminals of said clock generator means.

12. A multi-stage charge pump as claimed in claim 9, wherein said charge-up circuit comprises:
a third enhancement mode field-effect transistor having a drain-source path connected between said voltage source and one end of the drain-source path of said first enhancement mode field-effect transistor, and a gate electrode; and
a time constant circuit connected across said third and fourth output terminals of said clock generator means for successively applying voltages to the gate electrode of said first field-effect transistor in response to said third and fourth clock pulse sequences.

* * * * *